United States Patent
Chyi et al.

(10) Patent No.: US 8,586,995 B2
(45) Date of Patent: Nov. 19, 2013

(54) SEMICONDUCTOR ELEMENT HAVING HIGH BREAKDOWN VOLTAGE

(75) Inventors: Jen-Inn Chyi, Taoyuan (TW); Geng-Yen Lee, Taoyuan (TW); Hsueh-Hsing Liu, Taoyuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 13/571,041

(22) Filed: Aug. 9, 2012

(65) Prior Publication Data

US 2013/0240895 A1    Sep. 19, 2013

(30) Foreign Application Priority Data

Mar. 16, 2012 (TW) .............................. 101109065 A

(51) Int. Cl.
*H01L 29/205*    (2006.01)
*H01L 29/78*    (2006.01)

(52) U.S. Cl.
USPC ........................................... 257/76; 257/190

(58) Field of Classification Search
USPC ..................... 257/76, 190, E33.025
See application file for complete search history.

(56) References Cited

U.S. PATENT DOCUMENTS

2012/0025278 A1    2/2012   Hung
2013/0099245 A1*   4/2013   Ando et al. ..................... 257/76

* cited by examiner

*Primary Examiner* — Tran Tran
(74) *Attorney, Agent, or Firm* — Muncy, Geissler, Olds & Lowe, PLLC

(57) ABSTRACT

A semiconductor element having a high breakdown voltage includes a substrate, a buffer layer, a semiconductor composite layer and a bias electrode. The buffer layer disposed on the substrate includes a high edge dislocation defect density area. The semiconductor composite layer disposed on the buffer layer includes a second high edge dislocation defect density area formed due to the first high edge dislocation defect density area. The bias electrode is disposed on the semiconductor composite layer. A virtual gate effect of defect energy level capturing electrons is generated due to the first and second high edge dislocation defect density areas, such that an extended depletion region expanded from the bias electrode is formed at the semiconductor composite layer. When the bias electrode receives a reverse bias, the extended depletion region reduces a leakage current and increases the breakdown voltage of the semiconductor element.

12 Claims, 9 Drawing Sheets

SEMICONDUCTOR ELEMENT HAVING HIGH BREAKDOWN VOLTAGE

FIELD OF THE INVENTION

The present invention relates to a semiconductor element, and particularly to a semiconductor element having a high breakdown voltage.

BACKGROUND OF THE INVENTION

A power electronics including a transistor and a Schottky diode is frequently operated under high-power and high-temperature environments. Hence, III-nitrides having a high electric field and a large bandgap are often selected as an optimal choice for manufacturing a high-voltage and high-power power electronics including a transistor and a Schottky diode. Such power rectifier is applicable to high-power electronic elements including power distribution modules, power conditioning in large industrial motors, hybrid electric vehicles and switchers.

However, a Schottky diode and a transistor element manufactured from gallium nitride (GaN) usually suffer from unsatisfactory reverse leakage current and breakdown voltage. To achieve a low leakage and a high breakdown voltage, a solution of adding a guard ring having carriers in opposite polarities to a Schottky diode is provided in the prior art. Yet, on top of an additional masking process required for fabricating the guard ring, the guard ring also occupies an extra space such that a Schottky diode provided with a guard ring needs a larger space that disfavors a common goal of element miniaturization.

The US Patent Publication No. 20120025278 discloses a Schottky diode. The disclosed Schottky diode includes an ohmic contact layer formed by a semiconductor material, a metal layer serving as an anode, and a drift channel formed by a semiconductor material and formed between the ohmic contact layer and the metal layer. The drift channel includes a heavily-doped region neighboring to the ohmic contact layer, and a Schottky barrier is formed by the drift channel and the metal layer. When the Schottky diode is reversely biased, a pinch mechanism is applied to pinch the drift channel so that saturation or a leakage current between the metal layer and the ohmic contact layer is reduced.

Although the above Schottky diode does not need the design of a guard ring and is capable of reducing a leakage current as well as increasing a breakdown voltage of the Schottky diode, an overall manufacturing process is nevertheless made complicated due to the additional doping process for fabricating the heavily-doped region. Therefore, there is a need for an improved solution for providing a semiconductor element having a high breakdown voltage.

SUMMARY OF THE INVENTION

Therefore the primary object of the present invention is to solve the aforesaid disadvantages of unsatisfactory current leakage and breakdown voltage of a conventional Schottky diode and transistor element. Another object of the present invention is to overcome the issues of the additional fabricating processes for a guard ring and a heavily-doped region that are required for reducing a leakage current and increasing a breakdown voltage in conventional Schottky diode and transistor element.

To achieve the foregoing object, the present invention provides a semiconductor element having a high breakdown voltage. The semiconductor element comprises a substrate, a buffer layer, a semiconductor composite layer and a bias electrode. The buffer layer is disposed on the substrate layer, and comprises a first high edge dislocation defect density area. The semiconductor composite layer is disposed on the buffer layer, and comprises a second high edge dislocation defect density area formed due to the first high edge dislocation defect density area. The bias electrode is disposed on the semiconductor composite layer.

A virtual gate effect of defect energy level capturing electrons is generated due to the first and second high edge dislocation density areas, such that an extended depletion region expanded from the bias electrode is formed at the semiconductor composite layer.

Accordingly, with the extended depletion region formed by the virtual gate effect of the defect energy level capturing electrons, the breakdown voltage of the semiconductor element is effectively increased while the leakage current in the semiconductor element is also increased. Moreover, the semiconductor element provided by present invention requires no additional fabricating processes for the guard ring or the heavily-doped region, and is thus further advantaged by having a small volume and a simplified overall manufacturing process.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
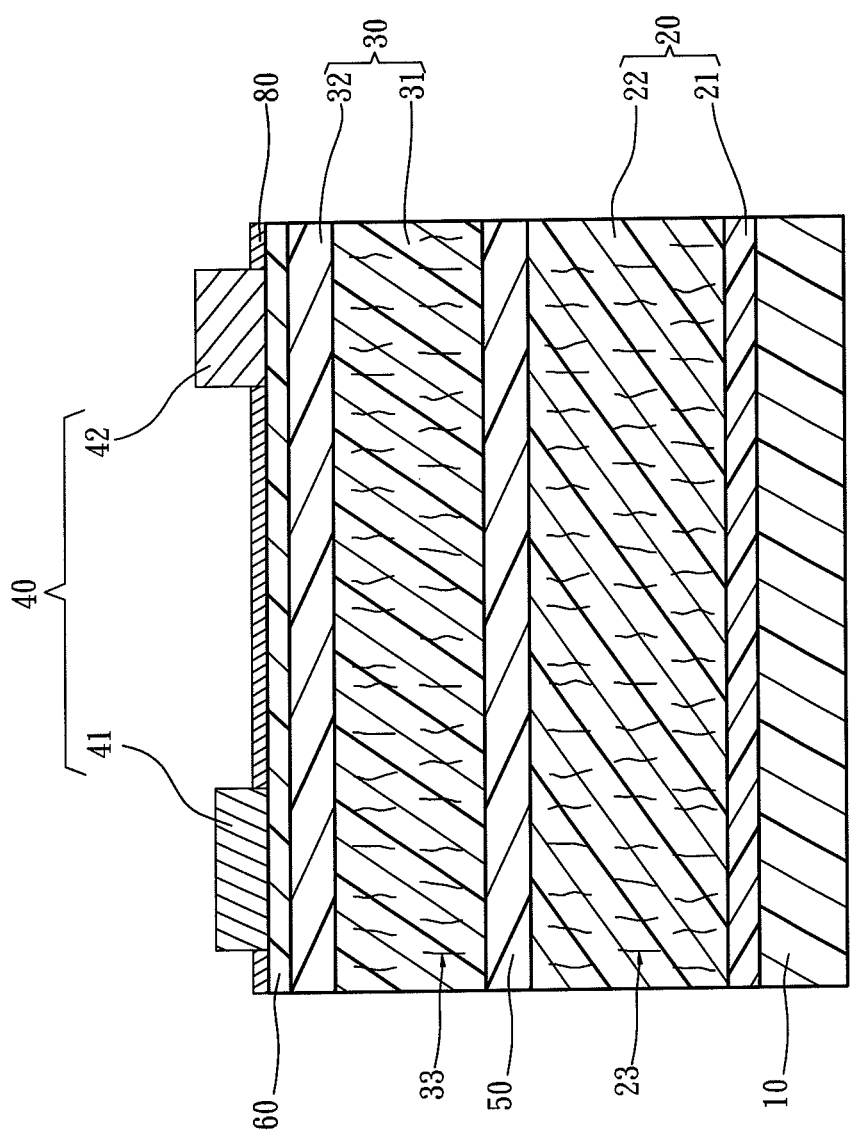
FIG. 1 is a sectional view of a semiconductor element according to a first embodiment of the present invention.

FIG. 1 shows a sectional view of a semiconductor element having a high breakdown voltage according to a first embodiment of the present invention. In this embodiment, for example, the semiconductor element is a Schottky diode. The semiconductor element comprises a substrate 10, a buffer layer 20, a semiconductor composite layer 30 and a bias electrode 40. The substrate 10 is a sapphire substrate. The buffer layer 20, disposed on the substrate 10, comprises an aluminum nitride (AlN) nucleation layer 21 and an AlN buffer layer 22 located on the AlN nucleation layer 21. The AlN buffer layer 22 comprises a first high edge dislocation defect density area. A common dislocation defect includes an edge dislocation defect, a spiral dislocation defect or a mixed dislocation defect. However, it should be noted that the first high edge dislocation defect density area according to the embodiment of the present invention means that the AlN buffer layer 22 has a larger number of edge dislocation defects 23 than that under a thermodynamic equilibrium state. AlN has a large bandgap (6.2 eV) and an extraordinarily high resistance, and is thus more particularly suitable as a buffer material.

Through measuring a full-width at half-maximum (FWHM) value of an X-ray rocking curve (XRC), types and densities of defects in a semiconductor material can be substantially and quantitatively measured. In a III-nitride semiconductor material having hexagonal closely packed crystals, a measured FWHM value of an XRC of a (0002) lattice plane represents a spiral dislocation defect density characteristic. The spiral dislocation defect density gets higher as the FWHM value gets wider, and spiral dislocation defect density gets lower as the FWHM value gets narrower. The measured FWHM value of the XRC of a (1-102) lattice plane represents a total density characteristic of all types of defects. By comparing the FWHM values of the XRC of the (0002) and (1-102) lattice planes, a ratio between the spiral dislocation defect density and the edge dislocation defect density can be quantitatively analyzed. In a III-nitride, the spiral dislocation defect density is a main leakage current path of an element, whereas the edge dislocation defect density is characterized by being capable of capturing electrons. More specifically, in this embodiment, the first high edge dislocation defect density area formed at the AlN layer 22 preferably has an FWHM value of the XRC at the AlN (0002) plane of smaller than 150 arc seconds, and an FWHM value of the XRC at the AlN (1-102) plane of between 1000 and 5000 arc seconds—hence the definition of the first high edge dislocation defect density area.

The semiconductor composite layer 30, disposed on the buffer layer 20, comprises a barrier layer 32 and a channel layer 31, with the barrier layer 32 being located away from the buffer layer 20. The channel layer 31 is adjacent to the barrier layer 32, and is located between the barrier layer 32 and the buffer layer 20. The barrier layer 32 has an energy level greater than that of the channel layer 31. In this embodiment, for example, the channel layer 31 is formed from $Al_xGa_{1-x}N$, where x ranges between 0 and 0.5. The barrier layer 32 is formed from $Al_yGa_{1-y}N$, where y is greater than x. For example, when x equals 0, the channel layer 31 is formed from GaN, and the barrier layer 32 is formed from aluminum gallium nitride (AlGaN). When x does not equal 0, the channel layer 31 is formed from AlGaN, and the barrier layer 32 is also formed from AlGaN, with the barrier layer 32 having a higher ratio of aluminum and thus a higher energy level than that of the channel layer 31. Further, the barrier layer 32 may be formed from $Al_zIn_{1-z}N$, wherein z>x. Alternatively, the channel layer 31 may also be a quaternary material such as $In_{x1}Al_{y1}Ga_{1-x2-y2}N$, and the coordinating barrier layer 32 above may be a group of the quaternary material of $In_{x2}Al_{y2}Ga_{1-x2-y2}N$, wherein y2>y1 and x1>x2.

In this embodiment, due to different lattice constants and different polarities between materials of the barrier layer 32 and the channel layer 31, stress and bandgap deformation are resulted to generate a two-dimensional gas (2-DEG) therein. The two-dimensional gas has a high concentration and a high carrier mobility for implementing a high current characteristic.

In this embodiment, the semiconductor composite layer 30 further comprises a second high edge dislocation defect density area at the channel layer 31. Similarly, the second high edge dislocation defect density area at the channel layer 31 has a larger number of dislocation defects 33 than that under a thermodynamic equilibrium state. More specifically, the second high edge dislocation defect density area formed at the channel layer 31 preferably has an FWHM value of the XRC at the AlGaN (0002) plane of smaller than 250 arc seconds, and an FWHM value of the XRC at the AlGaN (1-102) plane of between 500 and 2500 arc seconds—hence the definition of the second high edge dislocation defect density area.

The bias electrode 40 is disposed on the semiconductor composite layer 30. In this embodiment, the bias electrode 40 comprises a Schottky diode 41 and an ohmic electrode 42. For example, the Schottky diode 41 is formed from Ni/Au, and the ohmic electrode layer 42 is formed form Ti/Al/Ti/Au. It should be noted that a coordinating metal may be determined according to a formed Schottky contact or ohmic contact.

Further, in this embodiment, an intermediate layer 50 is provided between the buffer layer 20 and the semiconductor composite layer 30. For example, the intermediate layer 50 is formed from AlGaN, a periodic staggered structure of AlInN, AlGaN and GaN ($Al_zGa_{1-z}N$, where 0<z≤1), or a periodic staggered structure of AlInN and GaN ($Al_wIn_{1-w}N$, where 0≤w≤1). The intermediate layer 50 further mitigates the stress between the buffer layer 20 and the semiconductor composite layer 30 resulted from different lattice constants, and is also formed with a high edge dislocation defect density area due to effects of the first high edge dislocation defect density area. Further, the number of the dislocation defects 33 can be adjusted through the intermediate layer 50. In one embodiment, a cladding layer 60 is provided between the semiconductor composite layer 30 and the bias electrode 40. For example, the cladding layer 60 is formed from GaN, or InGaN for protecting the semiconductor composite layer 30 from oxidation. To prevent the semiconductor element from reacting with moisture in the air to undesirably affect characteristics of the semiconductor element, a passivation layer 80 is provided to cover a surface of the semiconductor element, revealing only the bias electrode 40. For example, the passivation layer 80 is formed from silicon dioxide ($SiO_2$), silicon nitride ($SiN_x$), gallium oxide ($Ga_2O_3$), aluminum oxide ($Al_2O_3$), gadolinium oxide ($Gd_2O_3$), hafnium oxide ($Hf_2O_3$) or aluminum nitride (AlN).

Figure 2:
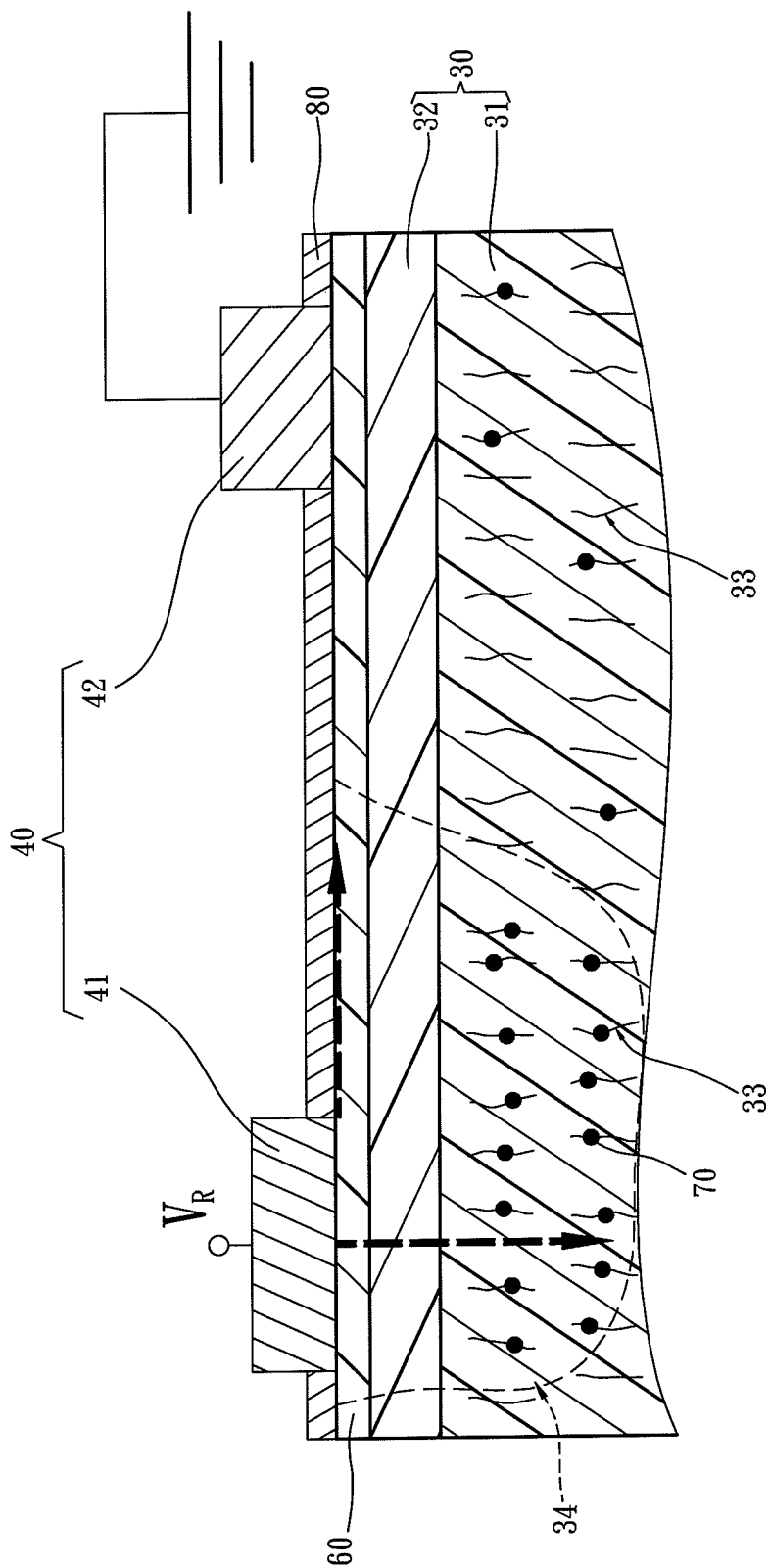
FIG. 2 is a schematic diagram illustrating a reverse bias according to the first embodiment of the present invention.

FIG. 2 shows a schematic diagram illustrating a reverse bias being applied to the semiconductor element according to the first embodiment of the present invention. When a reverse bias VR is applied to the bias electrode 41, a virtual gate effect is generated by defect energy level capturing electrons 70 at the second high edge dislocation defect density area at the semiconductor composite layer 30 corresponding to the Schottky diode 41. The virtual gate effect neutralizes background doping resulted from naturally formed epitaxy in the semiconductor composite layer 30, so as to form an extended depletion region 34 expanded from the bias electrode 34. Compared to a depletion region generated by a conventional Schottky diode that does not have the second high edge dislocation defect density, the extended depletion region 34 has a larger width and a greater depth, thereby increasing a voltage needed for generating a reverse breakdown at the channel layer 31 and further reducing a leakage current of the Schottky diode.

Figure 3A:
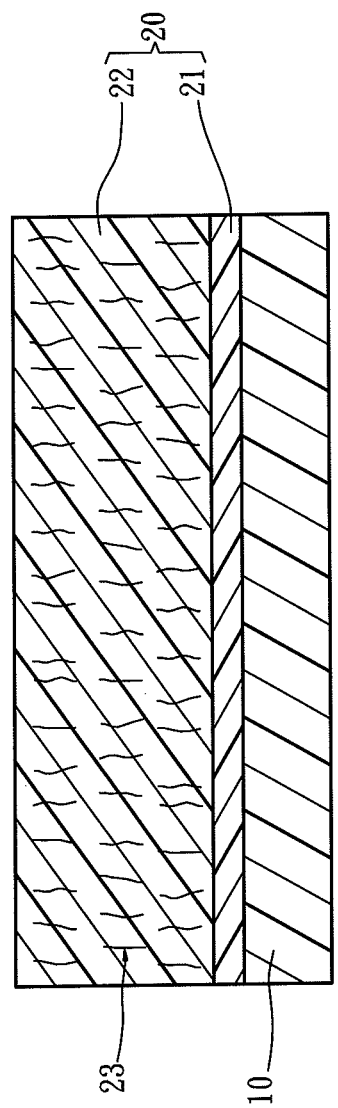
FIGS. 3A to 3D are schematic diagrams of a manufacturing process according to the first embodiment of the present invention.
Figure 3B:
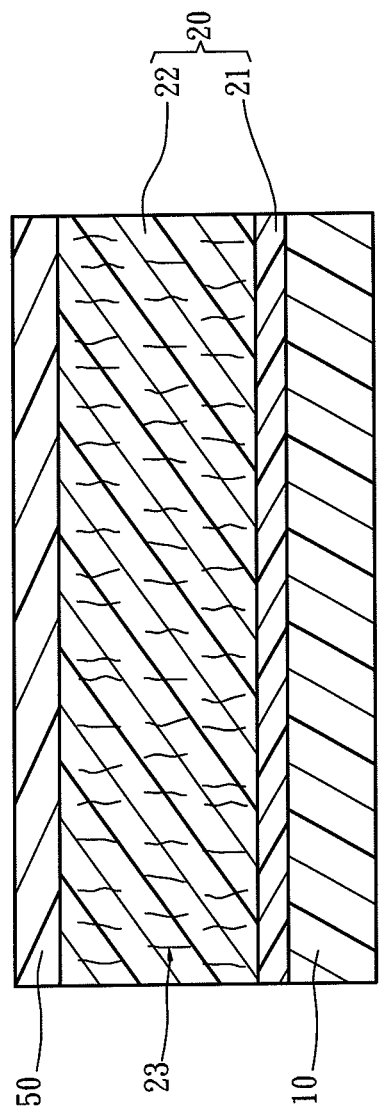

FIGS. 3A to 3D show schematic diagrams of a manufacturing process according to the first embodiment of the present invention. Referring to FIG. 3A, the substrate 10 formed from sapphire is selected, and the AlN nucleation layer 21 having a thickness of approximately 20 nm is developed on the substrate 10 by metal-organic chemical vapor deposition (MOCVD). The AlN buffer layer 22 having a thickness ranging between 0.02 um and 1 um is then developed at a temperature ranging between 1100° C. and 1200° C., so as to form the first high edge dislocation defect density area at the AlN buffer layer 22. Referring to FIG. 3B, the intermediate layer 50 is developed on the AlN buffer layer 22.

Figure 3C:
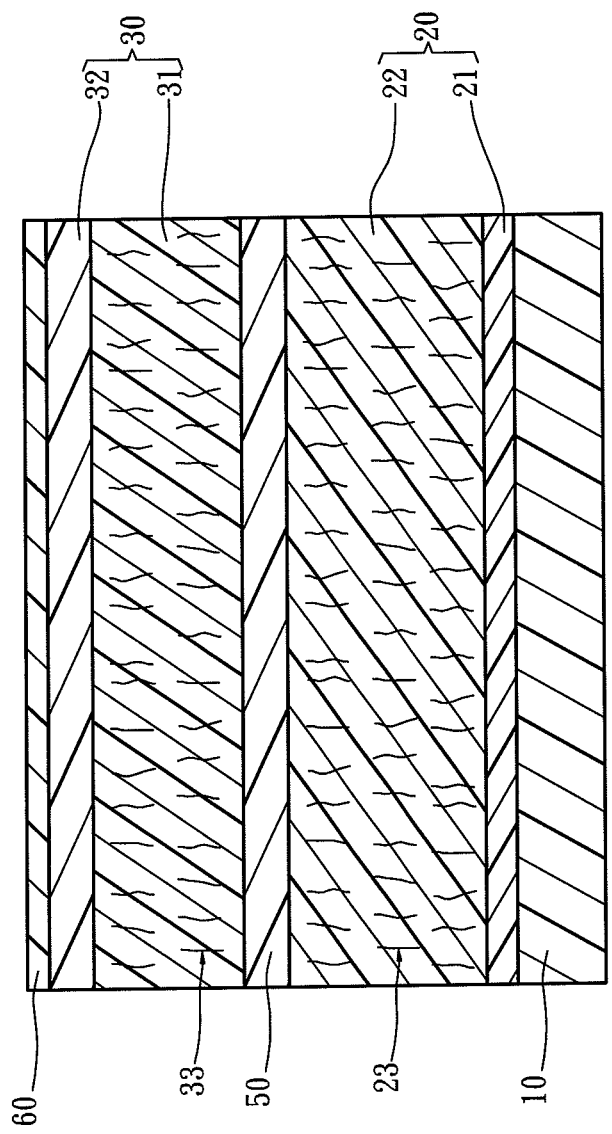

The intermediate layer 50 is formed from AlGaN and has a thickness of approximately 30 nm. Referring to FIG. 3C, the channel layer 31 is next developed, followed by developing the barrier layer 32 on the channel layer 31. The channel layer 31 is formed from GaN and has a thickness between 0.05 um to 1.5 um, and is developed at a temperature ranging between 1050° C. and 1150° C. Due to the first high edge dislocation defect density area at the AlN buffer layer 22, the intermediate layer 50 developed thereon is allowed to develop in a staggered manner in continuation of an atomic arrangement in the first high edge dislocation defect density area. Therefore, the intermediate layer 50 similarly has a higher edge dislocation defect density, and further influences the channel layer 31 developed on the intermediate layer 50 according to a similar mechanism to form the second high edge dislocation defect density area. The barrier layer 32 is formed from AlGaN and has a thickness between 20 nm and 50 nm. Next, the cladding layer 60 having a thickness of approximately 5 nm is developed on the barrier layer 32. The cladding layer 60 is formed from GaN.

Figure 3D:
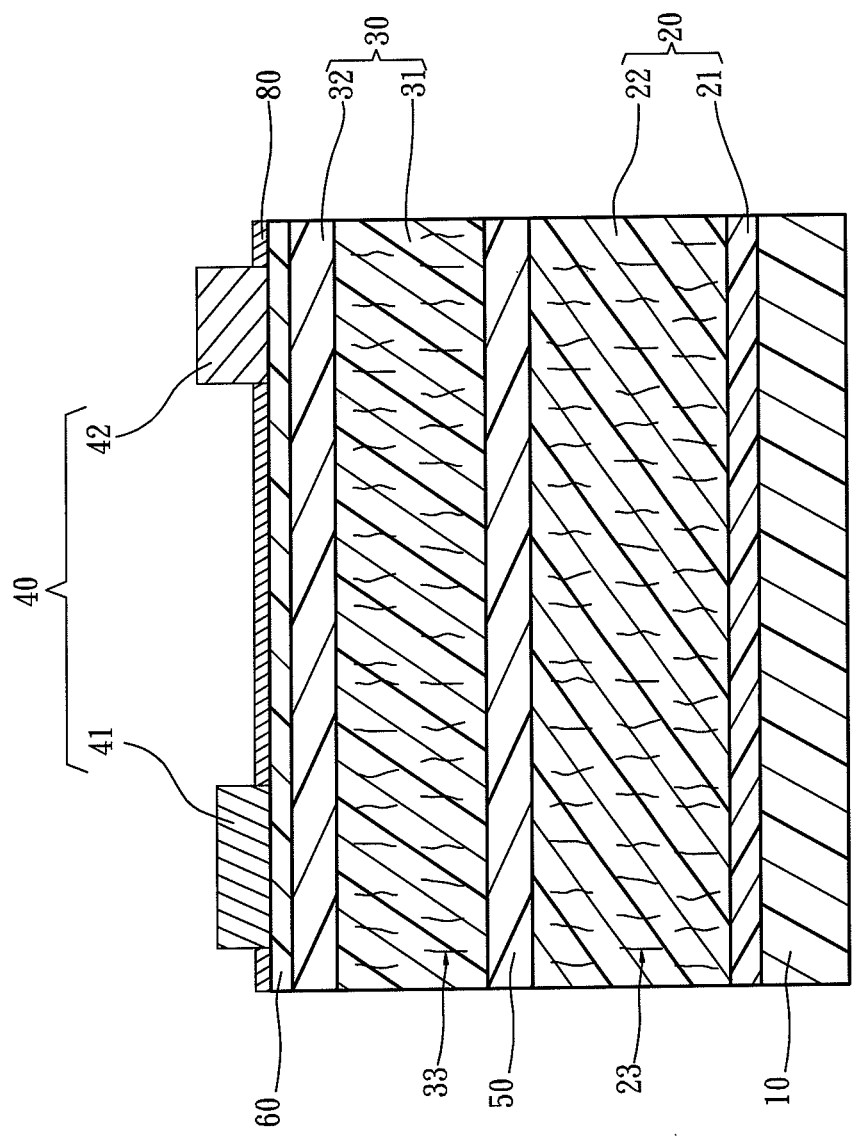

Referring to FIG. 3D, the bias electrode 40 is fabricated. An element area is first defined through dry etching performed by an inductively coupled plasma (ICP) system, and a predetermined position of the bias electrode 40 is defined on the cladding layer 60 by photoresist. By performing vapor deposition on Ti/Al/Ti/Au using electron beams and performing a high-temperature rapid thermal annealing process, the ohmic electrode 42 is formed. Next, the passivation layer 80 formed from SiO or SiN is developed on the surface of the cladding layer 60. The semiconductor element is then completed after forming the Schottky diode 41 by performing vapor deposition on Ni/Au.

Figure 4:
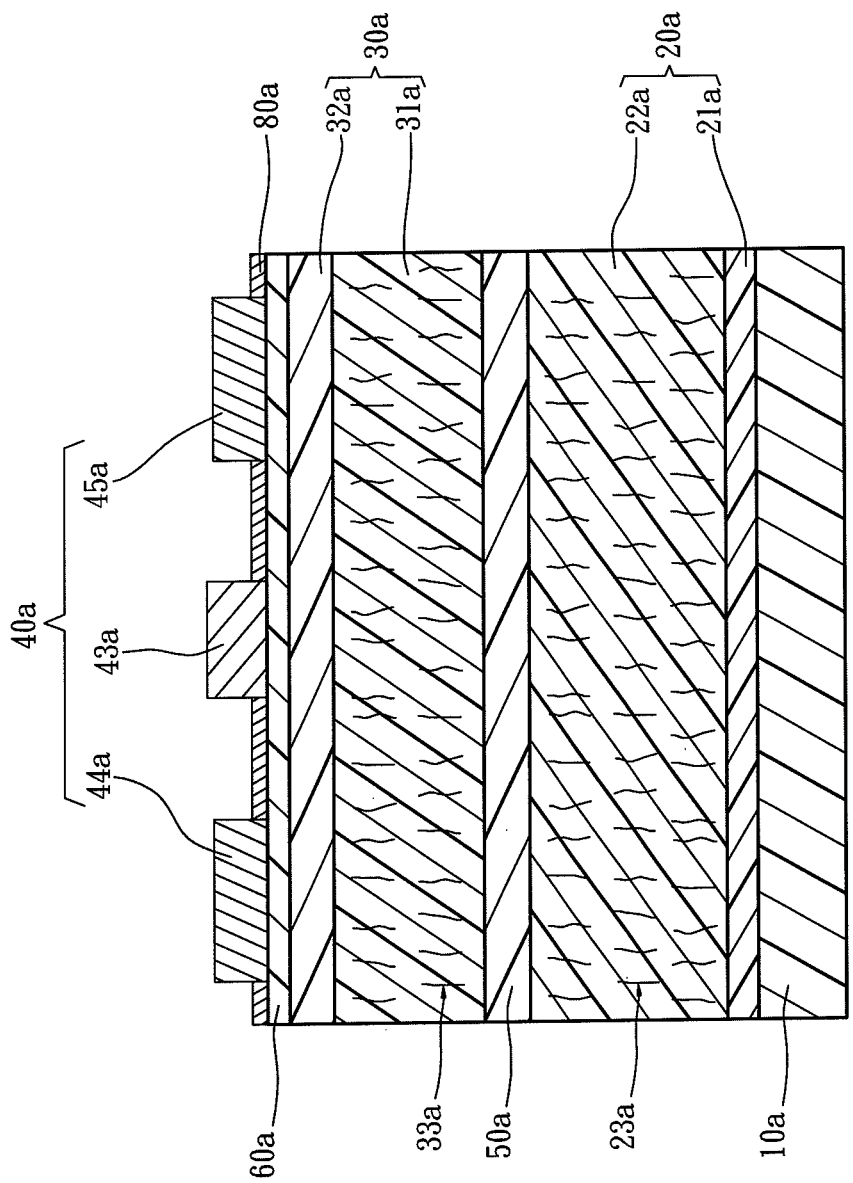
FIG. 4 is a sectional view of a semiconductor element according to a second embodiment of the present invention.

FIG. 4 shows a sectional view of a semiconductor element according to a second embodiment of the present invention. Compared to the first embodiment, a distinction of the second embodiment is that the bias electrode 41a comprises a gate electrode 43a, a source electrode 44a and a drain electrode 45a. The gate electrode 43a is located between the source electrode 44a and the drain electrode 45a. Accordingly, the semiconductor element forms a heterojunction field-effect transistor (HFET) having a low leakage current and a high breakdown voltage.

Figure 5:
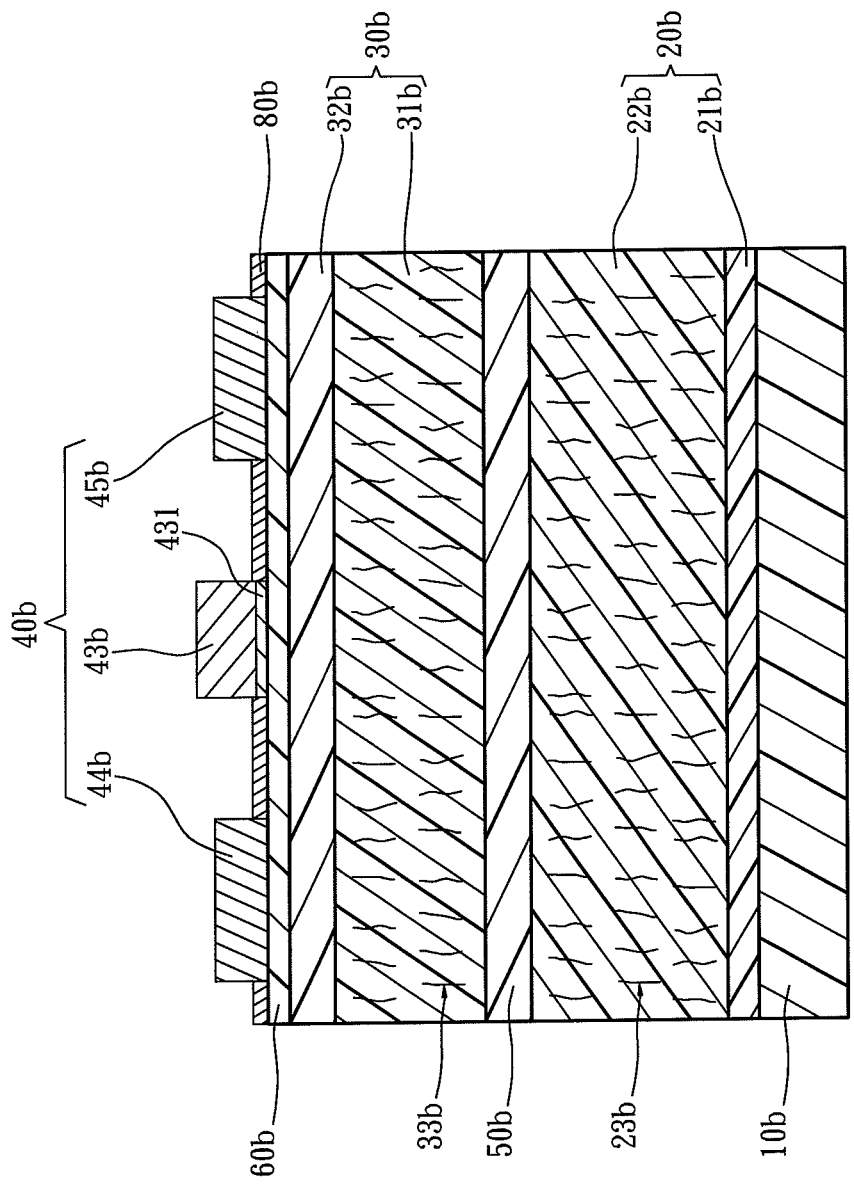
FIG. 5 is a sectional view of a semiconductor element according to a third embodiment of the present invention.

FIG. 5 shows a sectional view of a semiconductor element according to a third embodiment of the present invention. Compared to the second embodiment, a gate electrode 43b in the third embodiment further comprises a gate oxidation layer 431 in contact with a cladding layer 60b. The gate oxidation layer 431 is formed from a material selected from $SiO_2$, $SiN_x$, $Ga_2O_3$, $Al_2O_3$, $Gd_2O_3$, $Hf_2O_3$ or AlN. Accordingly, the semiconductor element forms a metal-oxide-semiconductor field-effect transistor (MOSFET) having a low leakage current and a high breakdown voltage. It should be noted that, in the second and third embodiments, the gate electrodes 43a and 43b are composed of Ni/Au and have a thickness of 30/300 nm, and the source electrodes 44a and 44b as well as the drain electrodes 45a and 45b are composed of Ti/Al/Ti/Au and have a thickness of 25/125/45/55 nm. The gate electrodes 43a and 43b are mainly for forming the Schottky contact, whereas the source electrodes 44a and 44b as well as the drain electrodes 45a and 45b are for forming the ohmic contact. It should be noted that the selections above are illustrative examples, and the specified types and thicknesses are not to be construed as limiting the present invention therein.

Figure 6:
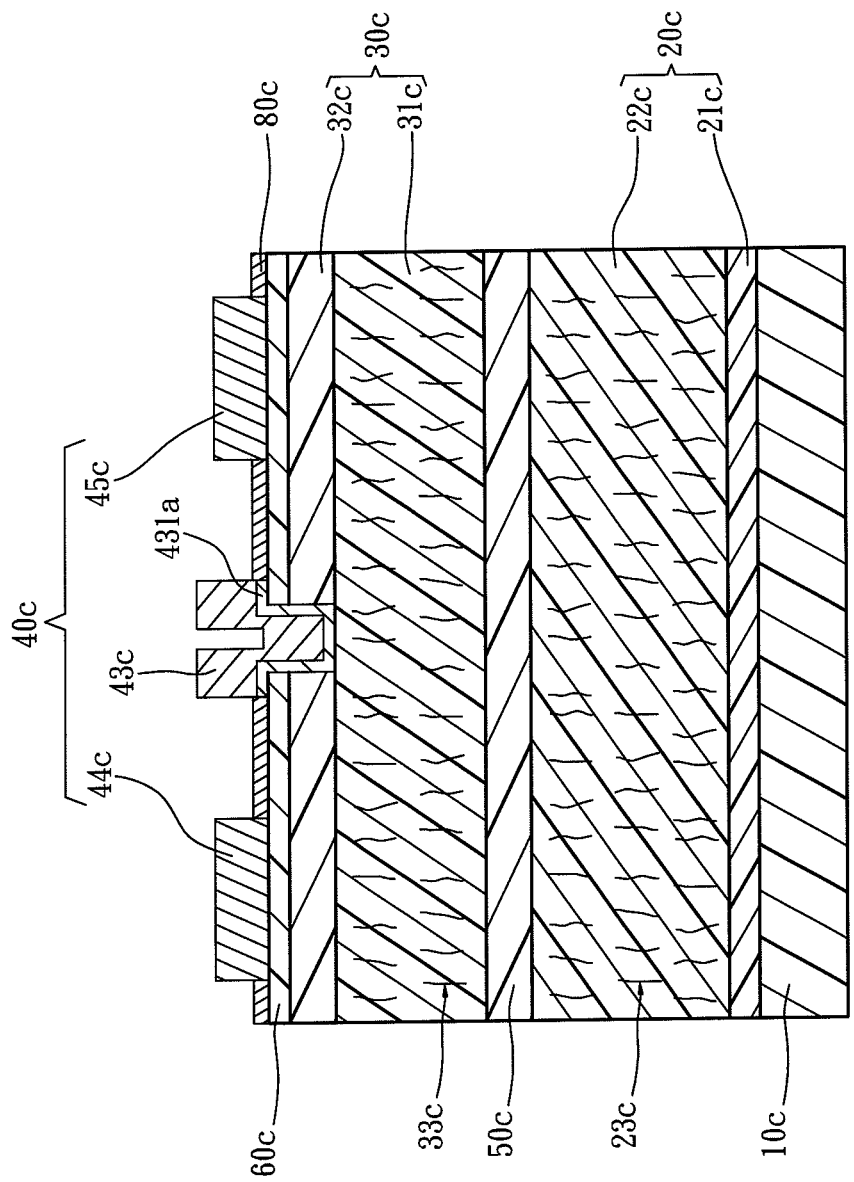
FIG. 6 is a sectional view of a semiconductor element according to a fourth embodiment of the present invention.

FIG. 6 shows a sectional view of a semiconductor element according to a fourth embodiment of the present invention. Compared to the third embodiment, a distinction of the fourth embodiment is that a recess is etched at a cladding layer 60c and a barrier layer 32c below a gate electrode 43c, such that a gate oxidation layer 431a of the gate electrode 43c is attached to an inner wall of the recess, and the gate electrode 43c is accommodated in the recess. Accordingly, the semiconductor element forms a gate recessed metal-oxide-semiconductor field-effect transistor (GR-MOSFET) having a normally-off characteristic, a low leakage current and a high breakdown voltage.

Therefore, according to the described embodiments of the present invention, the first high edge dislocation defect density area is formed at the buffer layer and the second edge dislocation defect density area is formed at the semiconductor composite layer, and the extended depletion region is formed by the virtual gate effect of capturing electrons at the semiconductor composite layer. As a result, the breakdown voltage of the semiconductor element is effectively increased while the leakage current in the semiconductor element is also increased. Moreover, the present invention requires no additional fabricating processes for the guard ring or the heavily-doped region, and is thus further advantaged by having a small volume and a simplified overall manufacturing process.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A semiconductor element having a high breakdown voltage, comprising:
   a substrate;
   a buffer layer, disposed on the substrate, comprising a first high edge dislocation defect density area;
   a semiconductor composite layer, disposed on the buffer layer, comprising a second high edge dislocation defect density area formed due to the first high edge dislocation defect density area; and
   a bias electrode, disposed on the semiconductor composite layer;
   wherein, the first and second high edge dislocation defect density areas generating a virtual gate effect of defect energy level capturing electrons to form an extended depletion region expanded from the bias electrode at the semiconductor composite layer.

2. The semiconductor element of claim 1, wherein the semiconductor composite layer comprises a barrier layer located away from the buffer layer, and a channel layer located adjacent to the barrier layer and between the barrier layer and the buffer layer, and the barrier layer has an energy level greater than that of the channel layer.

3. The semiconductor element of claim 2, wherein the channel layer is formed from a material selected from the group consisting of GaN, AlGaN and InAlGaN.

4. The semiconductor element of claim 2, wherein a full-width at half-maximum (FWHM) value of an X-ray rocking curve (XRC) at a (0002) plane of the second high edge dislocation defect density area is smaller than 250 arc seconds, and the FWHM value of the XRC at a (1-102) plane of the second high edge dislocation defect density area is between 500 and 2500 arc seconds.

5. The semiconductor element of claim 2, wherein the barrier layer is formed from a material selected from the group consisting of AlGaN, AlInN and AlGaInN.

6. The semiconductor element of claim 1, wherein the buffer layer is formed from a material of AlN.

7. The semiconductor element of claim 1, wherein an FWHM value of an XRC at a (0002) plane of the first high edge dislocation defect density area is smaller than 150 arc seconds, and the FWHM value of the XRC at a (1-102) plane of the first high edge dislocation defect density area is between 1000 and 5000 arc seconds.

8. The semiconductor element of claim 1, wherein a temperature for developing the buffer layer is between 1100° C. and 1200° C.

9. The semiconductor element of claim 1, further comprising an intermediate layer disposed between the buffer layer and the semiconductor composite layer.

10. The semiconductor element of claim 9, wherein the intermediate layer is formed from a material selected from the group consisting of GaN, AlGaN and AlInN.

11. The semiconductor element of claim 1, further comprising a cladding layer disposed between the bias electrode and the semiconductor composite layer.

12. The semiconductor element of claim 11, wherein the cladding layer is formed from a material of GaN or GaInN.

* * * * *